United States Patent
Fukumoto et al.

(10) Patent No.: US 10,743,445 B2
(45) Date of Patent: Aug. 11, 2020

(54) ELECTRONIC CIRCUIT COMPONENT PICK-UP INSTRUCTION DATA GENERATING DEVICE

(71) Applicant: FUJI CORPORATION, Chiryu (JP)

(72) Inventors: Ryohei Fukumoto, Anjo (JP); Kenji Sasaki, Obu (JP)

(73) Assignee: FUJI CORPORATION, Chiryu (JP)

( * ) Notice: Subject to any disclaimer, the term of this patent is extended or adjusted under 35 U.S.C. 154(b) by 244 days.

(21) Appl. No.: 15/103,995

(22) PCT Filed: Dec. 13, 2013

(86) PCT No.: PCT/JP2013/083460
§ 371 (c)(1),
(2) Date: Jun. 13, 2016

(87) PCT Pub. No.: WO2015/087440
PCT Pub. Date: Jun. 18, 2015

(65) Prior Publication Data
US 2016/0316591 A1    Oct. 27, 2016

(51) Int. Cl.
*H05K 13/04* (2006.01)
(52) U.S. Cl.
CPC ..... *H05K 13/0404* (2013.01); *H05K 13/0434* (2013.01)
(58) Field of Classification Search
CPC ............... G05B 15/02; H05K 13/0069; H05K 13/0404; H05K 13/0434
See application file for complete search history.

(56) References Cited

U.S. PATENT DOCUMENTS

| 5,811,980 A * | 9/1998 | Doyle | G01R 31/2813 |
| | | | 324/662 |
| 7,036,215 B2 * | 5/2006 | Kodama | H05K 13/0069 |
| | | | 29/740 |

(Continued)

FOREIGN PATENT DOCUMENTS

| EP | 2 728 990 A1 | 5/2014 |
| JP | 9-23092 A | 1/1997 |

(Continued)

OTHER PUBLICATIONS

Extended European Search Report dated Jul. 4, 2017 in European Patent Application No. 13899247.4.

(Continued)

*Primary Examiner* — Minh N Trinh
(74) *Attorney, Agent, or Firm* — Oblon, McClelland, Maier & Neustadt, L.L.P.

(57) ABSTRACT

An electronic-circuit-component pick-up instruction data generating device is provided that generates pick-up instruction data for automatically picking up an electronic circuit component from a nonmatrix tray defined to have nonmatrix arrangement in which arrangeable positions of the electronic circuit components are arranged in a nonmatrix pattern, other than a matrix tray defined to have matrix arrangement in which arrangeable positions of a plurality of the electronic circuit components are regularly arranged in a matrix pattern in a state of being positioned at all the intersection points made by two groups of straight lines that are parallel to two directions orthogonal to each other, respectively, and that are separated at regular intervals for each direction. An electronic-circuit-component mounting machine is provided that picks up an electronic circuit component from the nonmatrix tray based on generated pick-up instruction data, and automatically mounts the component on a circuit board.

3 Claims, 11 Drawing Sheets

(56) References Cited

U.S. PATENT DOCUMENTS

| | | | |
|---|---|---|---|
| 9,961,817 B2* | 5/2018 | Shimizu | H05K 13/0469 |
| 2008/0154392 A1* | 6/2008 | Maenishi | H05K 13/0853 |
| | | | 700/32 |
| 2016/0316591 A1* | 10/2016 | Fukumoto | H05K 13/0434 |

FOREIGN PATENT DOCUMENTS

| | | |
|---|---|---|
| JP | 2000-208990 A | 7/2000 |
| JP | 2002-176296 A | 6/2002 |
| JP | 2008-10594 A | 1/2008 |
| JP | 2011-258628 A | 12/2011 |
| JP | 2012-151231 A | 8/2012 |
| JP | 2013-12526 A | 1/2013 |

OTHER PUBLICATIONS

International Search Report dated Feb. 4, 2014 in PCT/JP2013/083460 filed Dec. 13, 2013.
Office Action dated May 17, 2018 in Chinese Patent Application No. 201380081438.0 submitting English translation only, 7 pages.
Office Action dated Aug. 1, 2017 in Japanese Patent Application No. 2015-552266 submitting unedited computer generated English translation only, 3 pages.

* cited by examiner

ELECTRONIC CIRCUIT COMPONENT PICK-UP INSTRUCTION DATA GENERATING DEVICE

FIELD OF THE DISCLOSURE

The present disclosure relates to an electronic-circuit-component mounting machine that automatically mounts an electronic circuit component on a circuit substrate, and to an electronic-circuit-component pick-up instruction data generating device that generates pick-up instruction data for causing the electronic-circuit-component mounting machine to automatically pick up an electronic circuit component from a tray which supports a plurality of electronic circuit components arranged in a planar manner.

DESCRIPTION OF THE RELATED ART

A tray which supports a plurality of electronic circuit components arranged in a planar manner, and an electronic-circuit-component mounting machine that automatically picks up the electronic circuit component from the tray and mounts the component on a circuit substrate such as a circuit board, both are disclosed in the following PTLS 1 and 2, or the like, and have been widely used. However, in the related art, the tray used in the electronic-circuit-component mounting machine is a matrix tray in which a plurality of cavities are formed to be regularly arranged in a state in which the centers of the respective cavities are positioned at all the intersection points made by two groups of straight lines that are parallel to two directions orthogonal to each other, respectively, and that are separated at regular intervals for each direction. Here, it is not possible to use and to set another type of tray in the electronic-circuit-component mounting machine.

CITATION LIST

Patent Literature

PTL 1: JP-A-2000-208990
PTL 2: JP-A-2008-010594

BRIEF SUMMARY OF THE DISCLOSURE

In comparison, some electronic circuit components are supplied and held by a nonmatrix tray that does not have the matrix arrangement of arrangeable positions of the electronic circuit components. Thus, in the related art, normally, the electronic circuit components held and supplied by such a nonmatrix tray are manually mounted on the circuit substrate, and thus, there is a need to rearrange the electronic circuit components on a separately prepared matrix tray such that the electronic-circuit-component mounting machine performs the automatic mounting of the components.

The present disclosure is made to achieve an object of causing an electronic-circuit-component mounting machine to perform automatic mounting from a nonmatrix tray that holds electronic circuit components arranged in a planar manner, but that does not have matrix arrangement of the electronic circuit components.

The above described object is achieved by providing an electronic-circuit-component pick-up instruction data generating device that generates pick-up instruction data for automatically picking up an electronic circuit component from a tray set to have nonmatrix arrangement different from matrix arrangement in which arrangeable positions of a plurality of electronic circuit components are regularly arranged in a state of being positioned at all the intersection points made by two groups of straight lines that are parallel to two directions orthogonal to each other, respectively, and that are separated at regular intervals for each direction.

When the pick-up instruction data of the electronic circuit components from the tray on which the arrangeable positions of the electronic circuit component are arranged in a nonmatrix arrangement is generated, it is easy to generate the data. However, it is possible to generate the data by other means different, from the means above. For example, it is also possible to generate the data by inputting individual coordinate data of respective positions in the nonmatrix arrangement from an input device. In addition, the electronic-circuit-component pick-up instruction data generating device may be configured as a data generation-dedicated device, may be configured as a part of a control device of an electronic circuit component supply device, may be configured as a part of a control device of an electronic-circuit-component mounting machine, or may be configured as a part of a control device of an electronic-circuit-component mounting line including a plurality of electronic-circuit-component mounting machines.

The above object is also achieved by providing an electronic-circuit-component mounting machine including: (A) a circuit substrate holding device that holds a circuit substrate; (B) a tray that holds a plurality of electronic circuit components arranged in a planar manner; (C) a mounting device that includes a component holding tool and a movement applying device that applies a predetermined movement to the component holding tool, and that causes the component holding tool to pick up the electronic circuit component from the tray and to mount the component on the circuit substrate held in the circuit substrate holding device; and (D) a control device. The control device includes (a) a memory section that stores at least automatic mounting data containing the pick-up instruction data generated by the electronic-circuit-component pick-up instruction data generating device, and (b) a mounting device control section that controls the mounting device in response to the automatic mounting data stored in the memory section. The electronic circuit components in the nonmatrix arrangement can be automatically mounted on the circuit substrate.

The electronic-circuit-component pick-up instruction data generating device according to the present disclosure makes it possible to generate pick-up instruction data for automatically picking up electronic circuit components from a tray having arrangeable positions of a plurality of electronic circuit components in nonmatrix arrangement.

In addition, an electronic-circuit-component mounting machine according to the present disclosure makes it possible to perform automatic mounting of electronic circuit components held by a tray having arrangeable positions of the electronic circuit components in nonmatrix arrangement, to a circuit substrate, by causing a mounting control section to control mounting device based on automatic mounting data that is stored in a memory section and that contains pick-up instruction data generated by the electronic-circuit-component pick-up instruction data generating device. For example, it is possible to set multiple components which are freely arranged as available in the market, to an automatic mounting machine.

BRIEF DESCRIPTION OF DRAWINGS

FIG. 5A illustrates an example of a matrix tray; FIG. 5B illustrates an example of a nonmatrix tray; and FIG. 5C illustrates another example of the nonmatrix tray.

DETAILED DESCRIPTION OF THE DISCLOSURE

Hereinafter, Example as an embodiment of the present disclosure will be described with reference to the drawings. Further, the present disclosure can be altered and modified in various manners into other embodiments based on knowledge of those skilled in the art, in addition to above Example.

Figure 1:
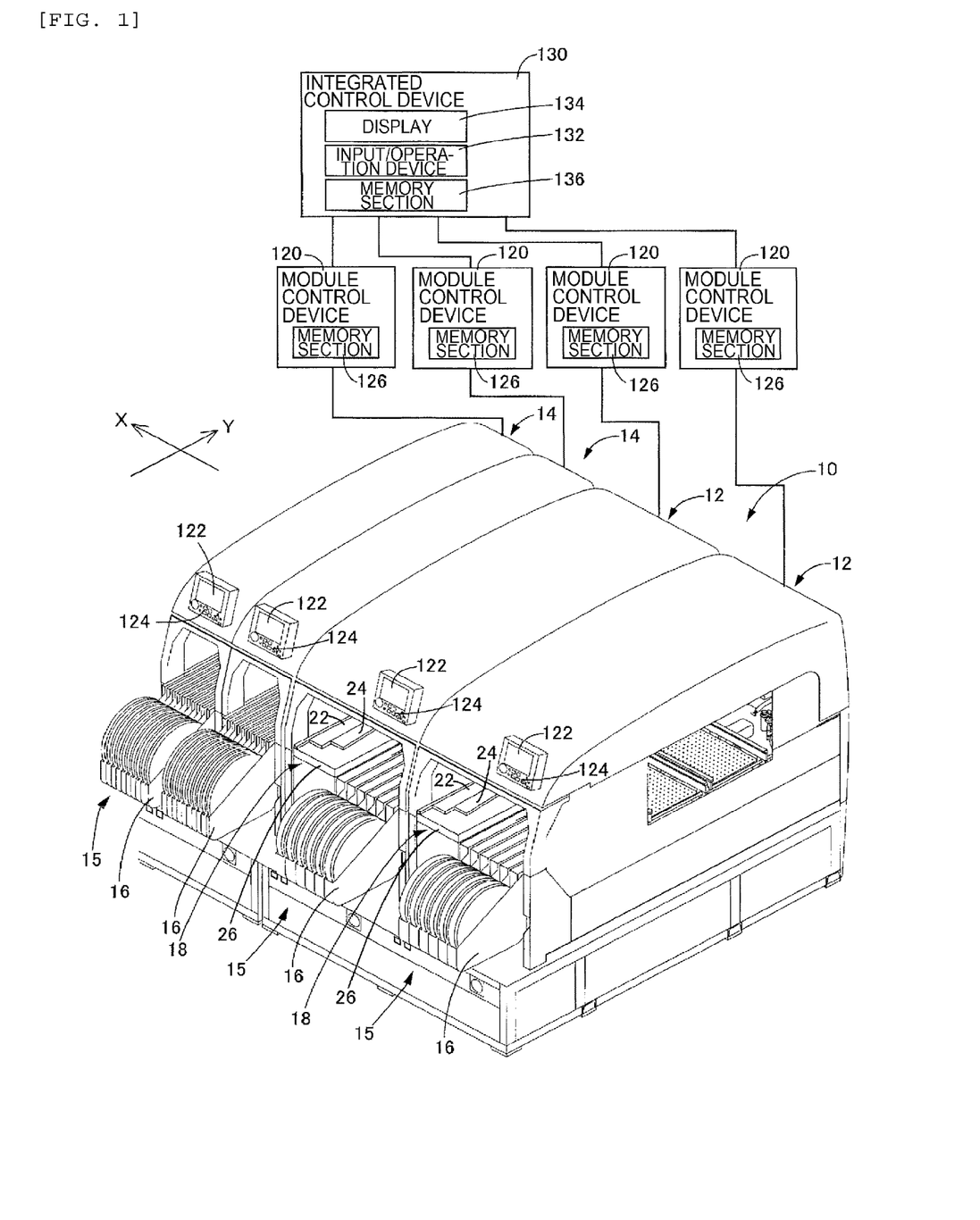
FIG. 1 is perspective view illustrating an electronic-circuit-component mounting line as Example of the present disclosure.

FIG. 1 illustrates an example of an electronic-circuit-component mounting line. Such an electronic-circuit-component mounting line 10 is configured to include a plurality of mounting modules 12 and 14, each of which is an electronic-circuit-component mounting machine, and which are arranged in one line. The mounting module 12 includes a tape feeder 16 and a tray feeder 18 as a component supply device 15, and the mounting module 14 includes only the tape feeder 16. The tape feeder 16 feeds, pitch by pitch, a component holding tape on which electronic circuit components (hereinafter, abbreviated to a component) are held at an equal pitch, and supplies the components in a preset supply section; however, the tape feeder is well known and thus, detailed description thereof is omitted.

Figure 5:
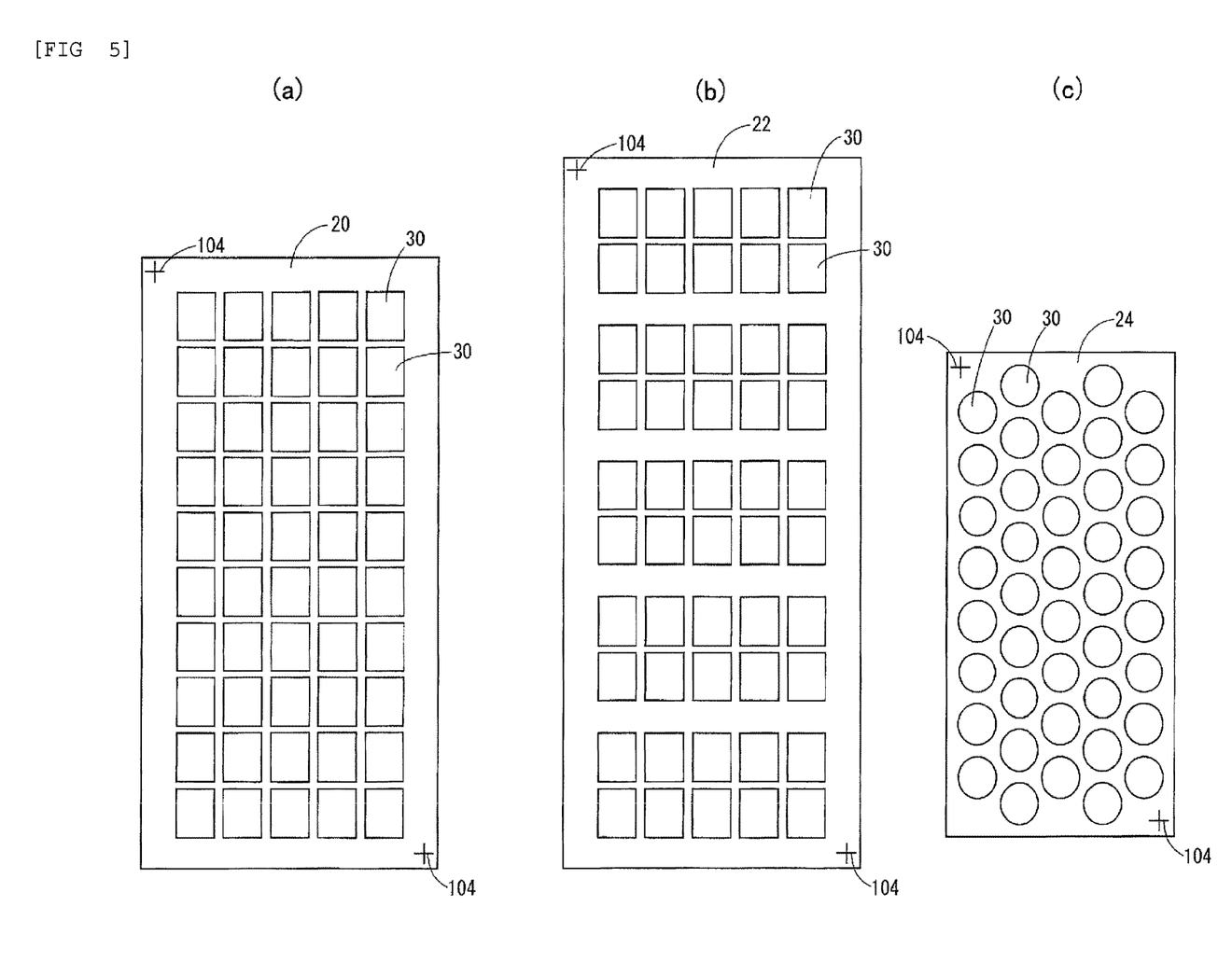
FIG. 5 illustrates plan views of a plurality of types of trays.
Figure 6:
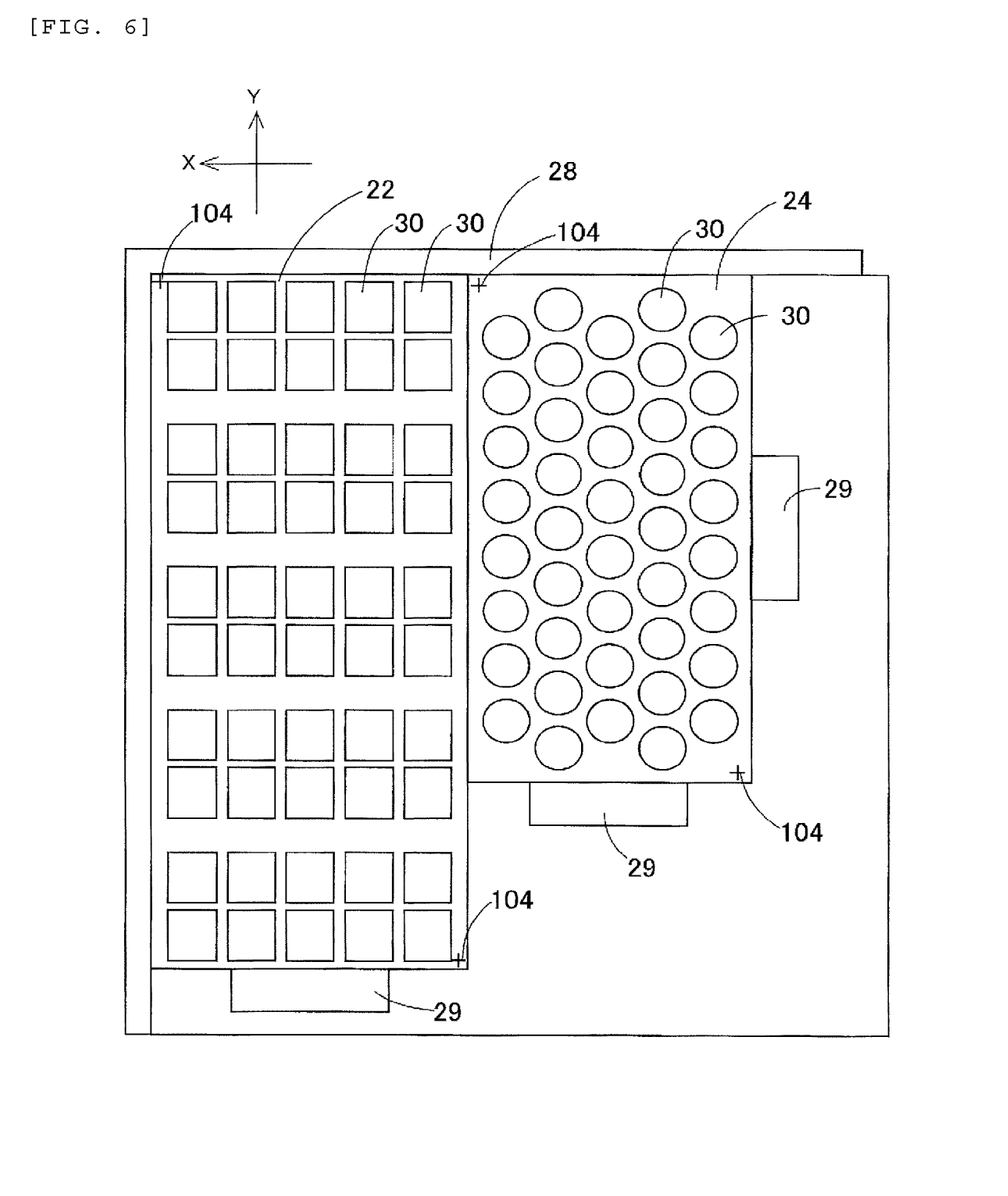
FIG. 6 is a plan view illustrating an example of a tray holding table.

The tray feeder 18 includes a tray holding table 26 that positions and holds a matrix tray 20 illustrated in FIG. 5A, or a nonmatrix tray 22 or 24 illustrated in FIG. 5B or 5C on a level support surface. Each of the trays 20, 22, and 24 has a rectangular shape, a fixed positioning member 28 and a detachable positioning member 29 are provided in the tray holding table 26 as illustrated in FIG. 6, and each of the trays 20, 22, and 24, is selectively positioned by the positioning member 28 or 29 and is held in an orientation in which two sides of the rectangular tray are parallel to an X axis and a Y axis, respectively.

In the nonmatrix trays 22 and 24, there are both a case where arrangeable positions of a plurality of components are set in a condition in which one component is disposed at one cavity (accommodating recessed portion), and a case where the arrangeable positions are set in a condition in which a plurality of components are disposed at one cavity 30. It is possible to consider the cavity 30 in the former case as a real cavity, and an arrangeable position for one component in the latter case as a virtual cavity, and, in this description and claims of the present application, the term, "cavity" means both the real cavity and the virtual cavity.

On the nonmatrix tray 22 illustrated in FIG. 5B, the cavity 30 is illustrated as the real cavity, for easy understanding; however, the cavity often means the virtual cavity and a plurality of (two in the case in FIG. 6) components are arranged in a state of being in contact with each other at one accommodating recessed portion. It is advantageous to use this type of tray in that multiple simple-shaped components can be held on a relatively small tray.

It is advantageous to use the nonmatrix tray 24 illustrated in FIG. 5C in that a pitch between columns of components having a circular or similar shape is decreased and thereby, multiple components can be held on a relatively small tray.

Figure 2:
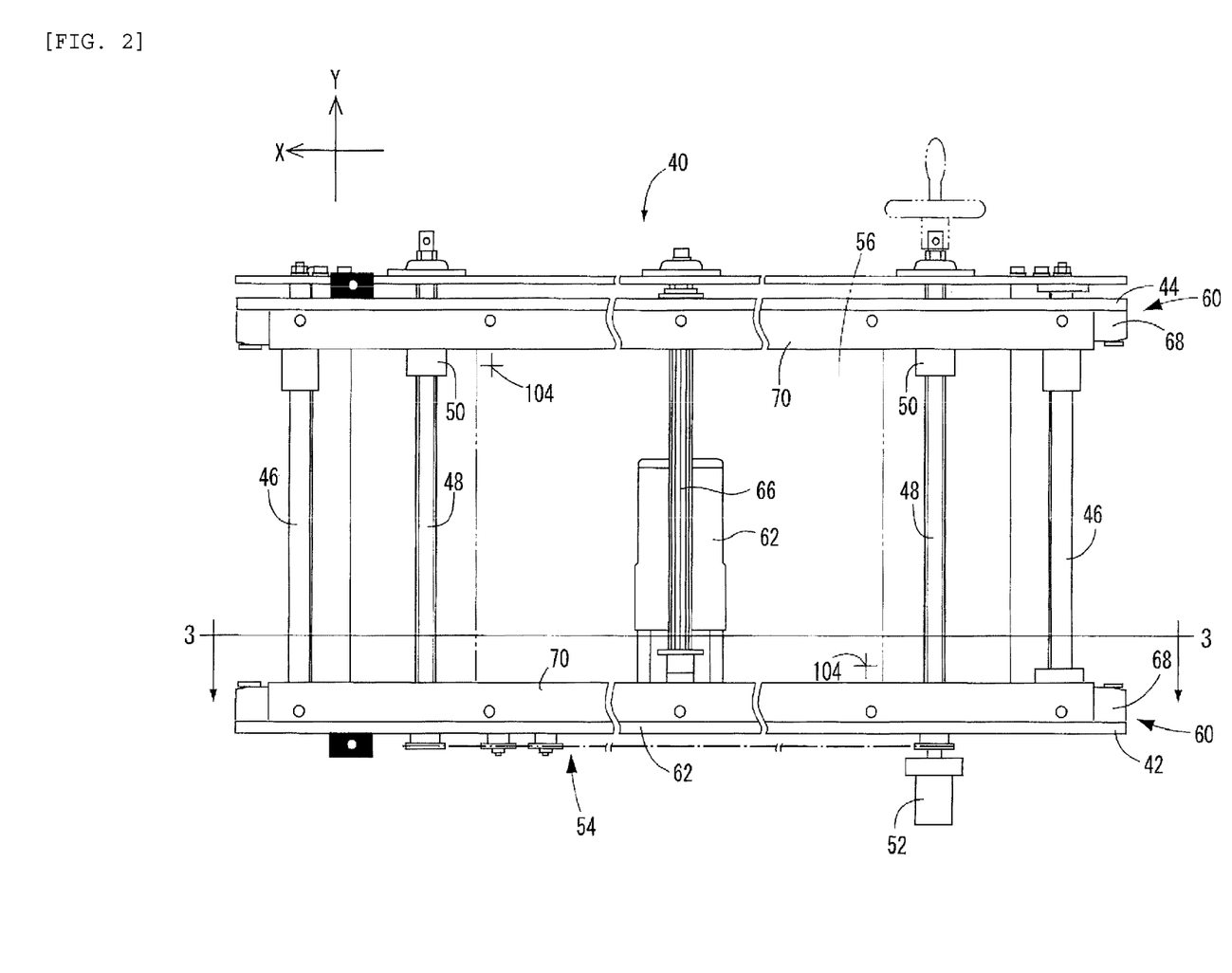
FIG. 2 is a plan view illustrating a circuit board conveyance device in one electronic-circuit-component mounting machine configuring the electronic-circuit-component mounting line.
Figure 3:
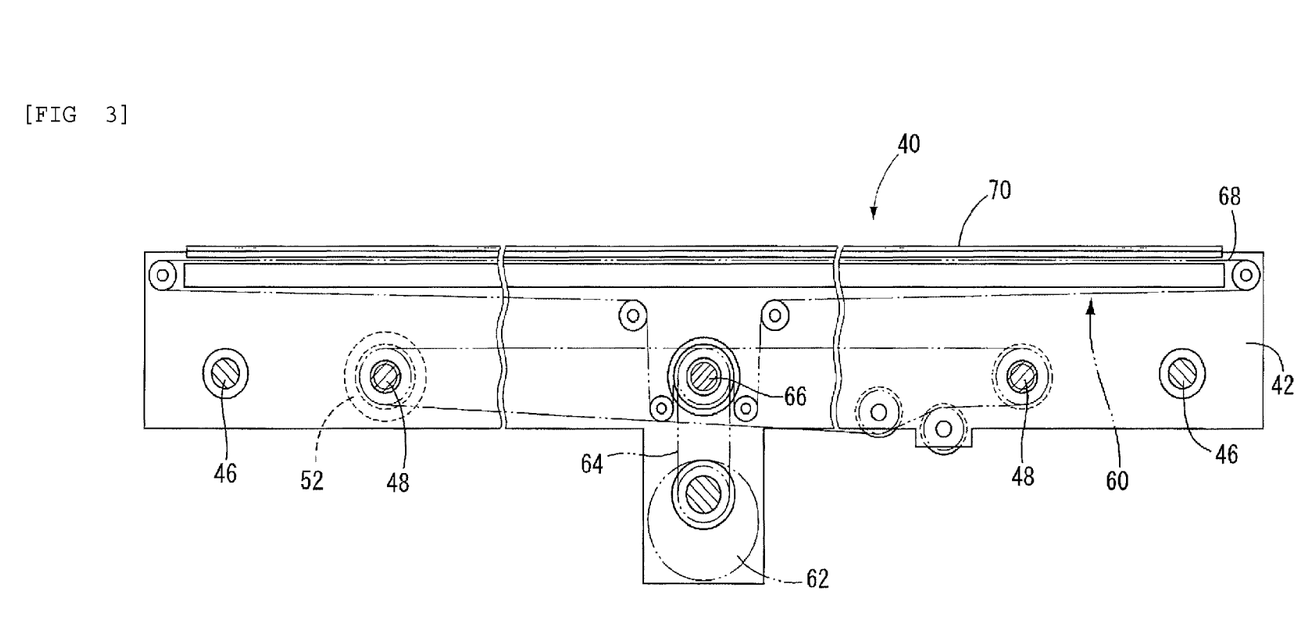
FIG. 3 is a sectional view taken along line 3-3 in FIG. 2.

Each of the mounting modules 12 and 14 further includes a board conveying and holding device 40 illustrated in FIGS. 2 and 3. The board conveying and holding device 40 includes a fixed guide rail 42 and a movable guide rail 44 which extend parallel to each other. The movable guide rail 44 can approach and can be separated from the fixed guide rail 42 following along guiding by a pair of guide members 46 provided between both the guide rails 42 and 44. The movable guide rail 44 includes a pair of nuts 50 screwed to a pair of lead screws 48 and approaches and is separated from the fixed guide rail 42 by the pair of lead screws 48 synchronized with each other to be rotated by a servomotor 52 and a rotation transmitting device 54. In this manner, a distance between both the guide rails 42 and 44 is adjusted to equal a width of a circuit board 56 which is to be conveyed.

Conveyance belts 60 are held in a circling-movement manner by both the guide rails 42 and 44, respectively, and a pair of the conveyance belts 60 are synchronized with each other to move in a circle by a servomotor 62, a rotation transmitting device 64, and a spline shaft 66, support both sides of the circuit board 56, and convey the circuit board by conveyance sections 68 which extend parallel to each other. At that time, the pair of guide rails 42 and 44 guide both side end surfaces of the circuit board 56. In addition, a lifting and lowering base omitted in the drawings is provided at a position between both the guide rails 42 and 44 and the circuit board 56 is lifted by being supported by support members such as a plurality of support pins or the like, which are attached to the lifting and lowering base. Here, both side end portions of the circuit board 56 are raised from the conveyance sections 68 and the circuit board is pressed and fixed to a lower surface of a reception member 70.

Figure 4:
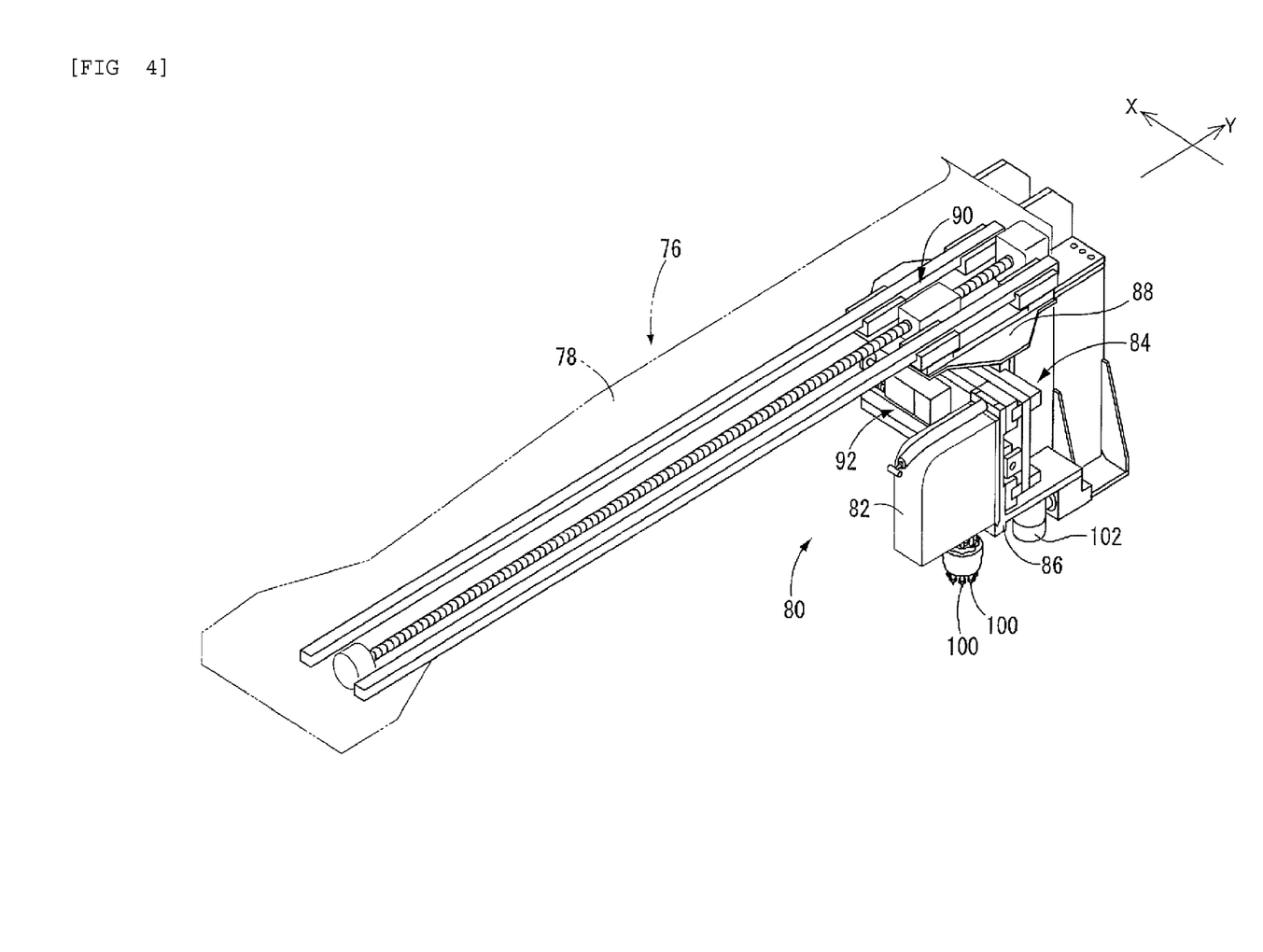
FIG. 4 is a perspective view illustrating a mounting device in one electronic-circuit-component mounting machine configuring the electronic-circuit-component mounting line illustrated in FIG. 1.

Each of the mounting modules 12 and 14 further includes a mounting device 80 illustrated in FIG. 4. The mounting device 80 is supported by an upper beam 78 of a module main body 76 and includes a mounting head 82 and a head moving device 84 that causes the mounting head 82 to move to any position in an X-axial direction and a Y-axial direction orthogonal to each other. The head moving device 84 includes an X-axial slider 86 and a Y-axial slider 88. A Y-axis drive device 90 causes the Y-axial slider 88 to move to any position in the Y-axial direction and an X-axis drive device 92 causes the X-axial slider 86 to move to any position in the X-axial direction on the Y-axial slider 88, thereby causing the mounting head 82 to move to any position in an X-Y plane. The mounting head 82 can be detachably attached to the X-axial slider 86, and a multi-nozzle head, as a component holding tool, including a plurality of suction nozzles 100 is illustrated in FIG. 4. An imaging device 102 is further attached to the X-axial slider 86. The imaging device 102 captures a plurality of fiducial marks 104 provided on the circuit board 56 or the tray 20, 22, or 24, thereby detecting a position of the circuit board 56 or the tray 20, 22, or 24.

As illustrated in FIG. 1, a module control device 120 is provided in each of the mounting modules 12 and 14 described above, and an integrated control device 130, which performs integrated control of the entire electronic-circuit-component mounting line 10, is connected to the module control devices 120. Each module control device 120 includes a display 122 and an input/operation device 124 which are provided on an upper front portion of each of the mounting modules 12 and 14, and the integrated control device 130 also includes a display 134 and an input/operation device 132. An operator can perform input or operation to individual mounting modules 12 and 14 by operating the input/operation device 124 while looking at a display on the display 122; however the operator can perform input or instruction to the mounting modules 12 and 14 and the entire electronic-circuit-component mounting line 10 by operating the input/operation device 132 while looking at a display on the display 134 of the integrated control device 130.

The input, operation, and instruction related to the matrix tray are well known and thus, description thereof is omitted. Hereinafter, the input, operation, and instruction related to the nonmatrix tray will be described as specific features in the present disclosure. Here, since a mounting motion of the component to the circuit board 56 is not changed whether the tray is the matrix tray or the nonmatrix tray, and there is a difference only in a pick-up motion of the component from the tray, hereinafter, the pick-up of the component from the nonmatrix tray and, particularly, the generation of the pick-up instruction data will be described in detail.

The pick-up instruction data from the nonmatrix tray is generated based on the pick-up instruction data from the matrix tray; however, it is desirable that it is not essential to generate the data based on the pick-up instruction data from the matrix tray. For example, it is convenient to generate pick-up instruction data from the nonmatrix tray 22 illustrated in FIG. 5B based on pick-up instruction data from the matrix tray 20 illustrated in FIG. 5A.

Figure 9:
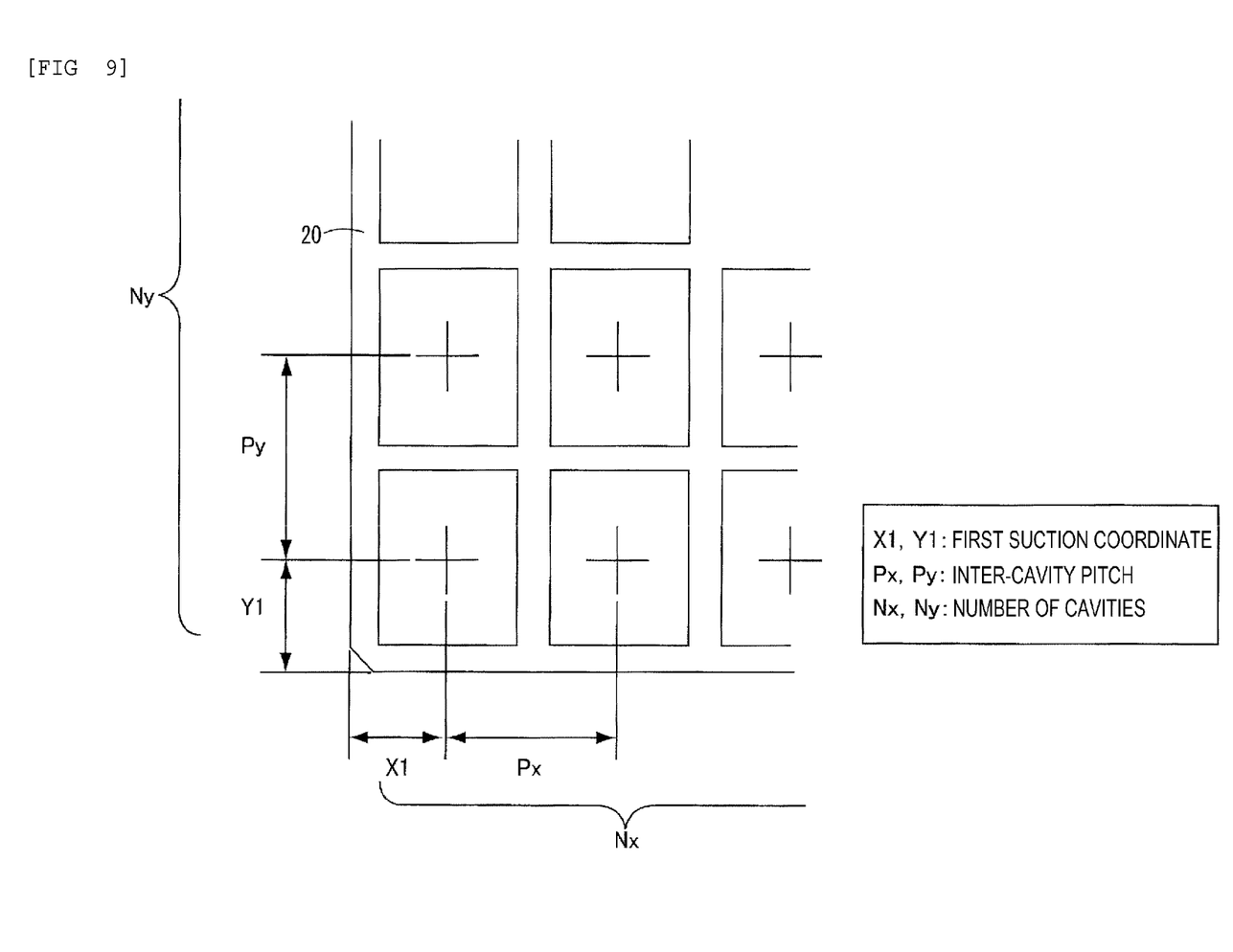
FIG. 9 is a view depicting an example of pick-up instruction data of electronic circuit components from the matrix tray illustrated in FIG. 5A.
Figure 10:
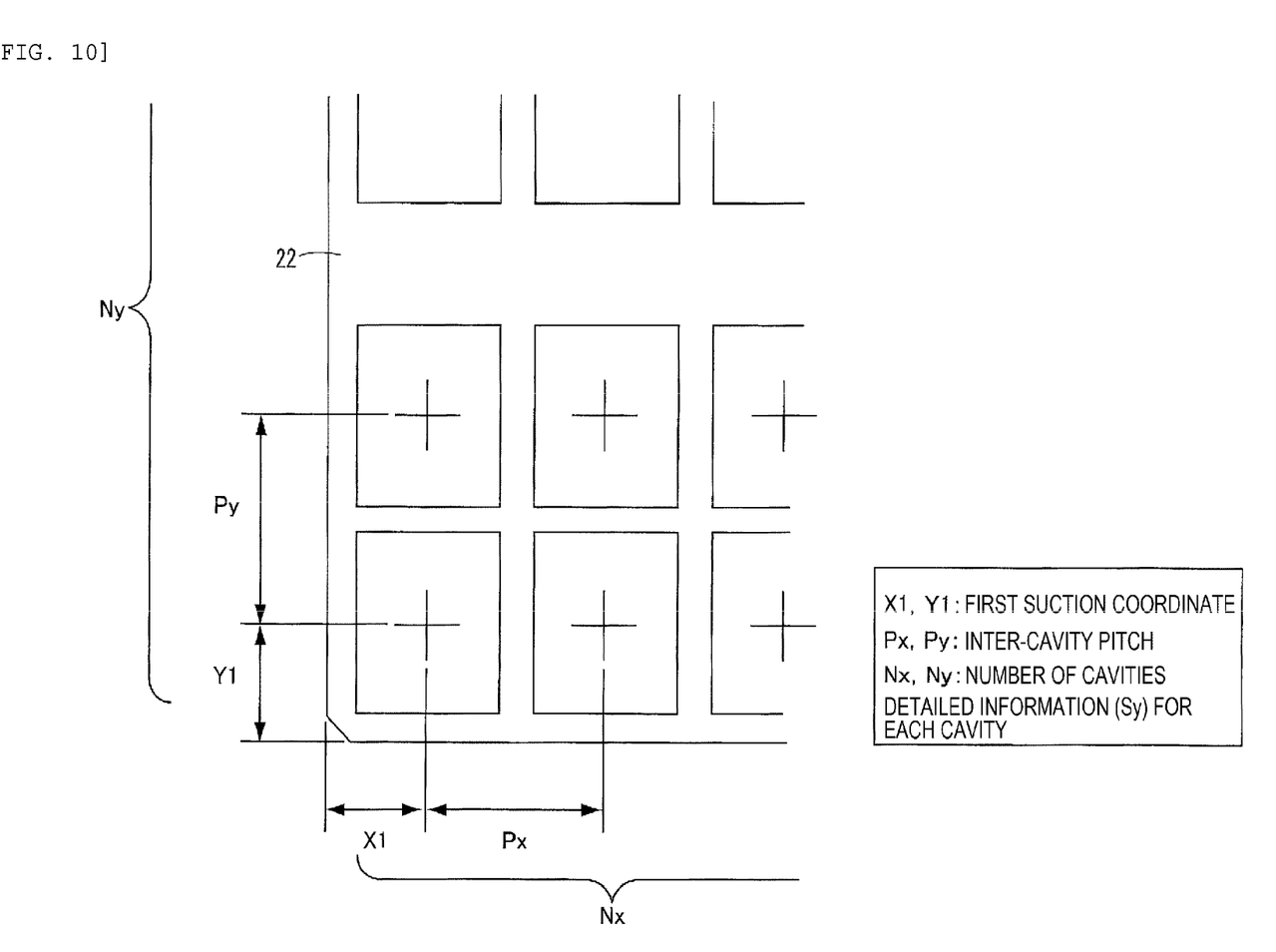
FIG. 10 is a view depicting an example of pick-up instruction data of electronic circuit components from the nonmatrix tray illustrated in FIG. 5B.
Figure 11:
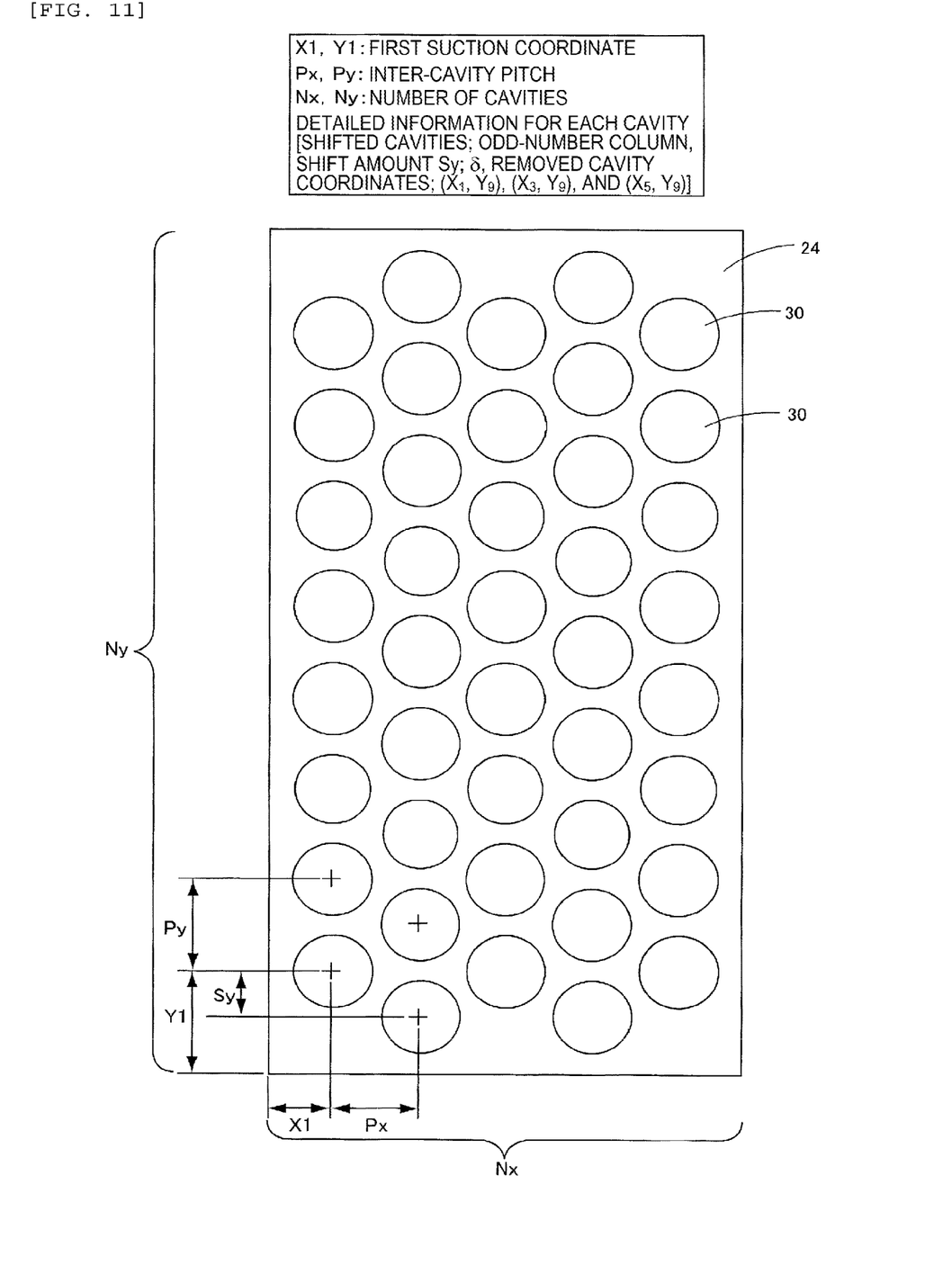
FIG. 11 is a view depicting an example of pick-up instruction data of electronic circuit components from the nonmatrix tray illustrated in FIG. 5C.

As illustrated in FIG. 9, the pick-up instruction data from the matrix tray 20 is configured to contain a first suction coordinate (X1, Y1) as a coordinate of the central position of the cavity 30 from which the component is first to be picked up, inter-cavity pitches Px and Py in the X-axial direction and the Y-axial direction, and the numbers of cavities Nx and Ny in the X-axial direction and in the Y-axial direction, respectively. The pick-up instruction data is stored in a memory section 126 (refer to FIG. 1) of the module control device 120 of each of the mounting modules 12 and 14, and each of the mounting modules 12 and 14 can pick up the components in order from the respective cavities 30 of the matrix tray 20 based on the data. The same is true of the mounting module in the related art; however, the mounting modules 12 and 14 of the present. Example can also pick up the components from the nonmatrix trays 22 and 24.

It is also possible to generate pick-up instruction data for picking up from the nonmatrix tray in the control device 120 of each of the mounting modules 12 and 14; however, in the present Example, the data is generated in the integrated control device 130, then, is transmitted to the control device 120 of each of the mounting modules 12 and 14, and is stored in the memory section 126. Hereinafter, the generation of the pick-up instruction data in the integrated control device 130 will be described.

The pick-up instruction data of the components from the nonmatrix tray 22 is generated based on the pick-up instruction data from the matrix tray 20 described above. In other words, as illustrated as step 1 in FIG. 7, the pick-up instruction data of the matrix tray 20 is first input from the input/operation device 132 of the integrated control device 130 illustrated in FIG. 1 and is stored in the memory section 136. The arrangement of the cavities 30 of the matrix tray 20 is displayed on the display 134, based on the pick-up instruction data.

Subsequently, as illustrated as step 2, the input/operation device 132 is operated so as to designate the uppermost two rows of cavities 30 surrounded in a two-dot chain line, of the cavities 30 displayed in the display 134 and a shift amount Sy of the cavities 30 in the Y-axial direction is input. As a result, the pick-up instruction data of the matrix tray 20 is modified and the display on the display 134 according to the modification is changed to a display in response to the modification (that is, input, shift amount) as illustrated on the right side of step 2. In the present Example, ten rows of cavities 30 are divided into five sets with two rows grouped in one set, and a value of 4δ, which is four times a gap δ between the sets, is input as the shift amount. Similarly, from here on, the designation of two rows of cavities 30 from the top and the input of the shift amounts (3δ, 2δ, and δ) of the cavities 30 are repeated, thereby the display of the cavities 30 on the display 134 is sequentially changed, and, finally, the nonmatrix tray 22 having a cavity arrangement on the right end in FIG. 7 is displayed on the display 134.

Figure 7:
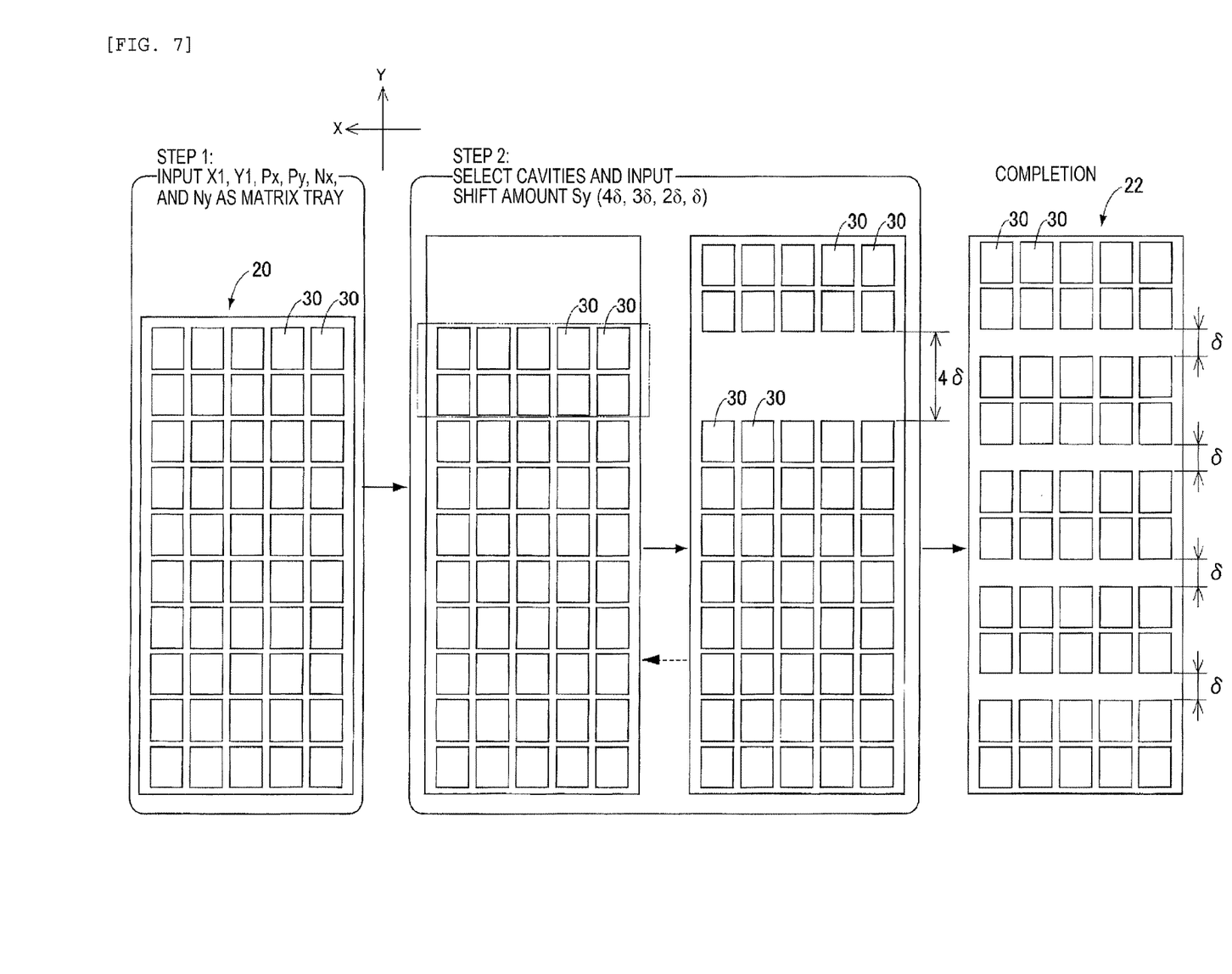
FIG. 7 is a view illustrating a procedure of generating cavity arrangement data of the nonmatrix tray illustrated in FIG. 5B from cavity arrangement data of the matrix tray illustrated in FIG. 5A.

In other words, a generation procedure of the pick-up instruction data of the nonmatrix tray 22 is not limited to the procedure illustrated in FIG. 7, but, for example, instead of designating the uppermost two rows of cavities 30, in step 1, the uppermost eight rows of cavities 30 are designated and the shift amount δ between the sets is input, next, the uppermost six rows of cavities 30 are designated and the shift amount δ between the sets is input, and then, the same operation is repeated. Here, of the sets with one set made up of two rows, sets of upper rows are sequentially shifted from a set of lower rows, and, finally, it is possible to display the nonmatrix tray 22 having the cavity arrangement on the right end in FIG. 7 on the display 134.

Figure 8:
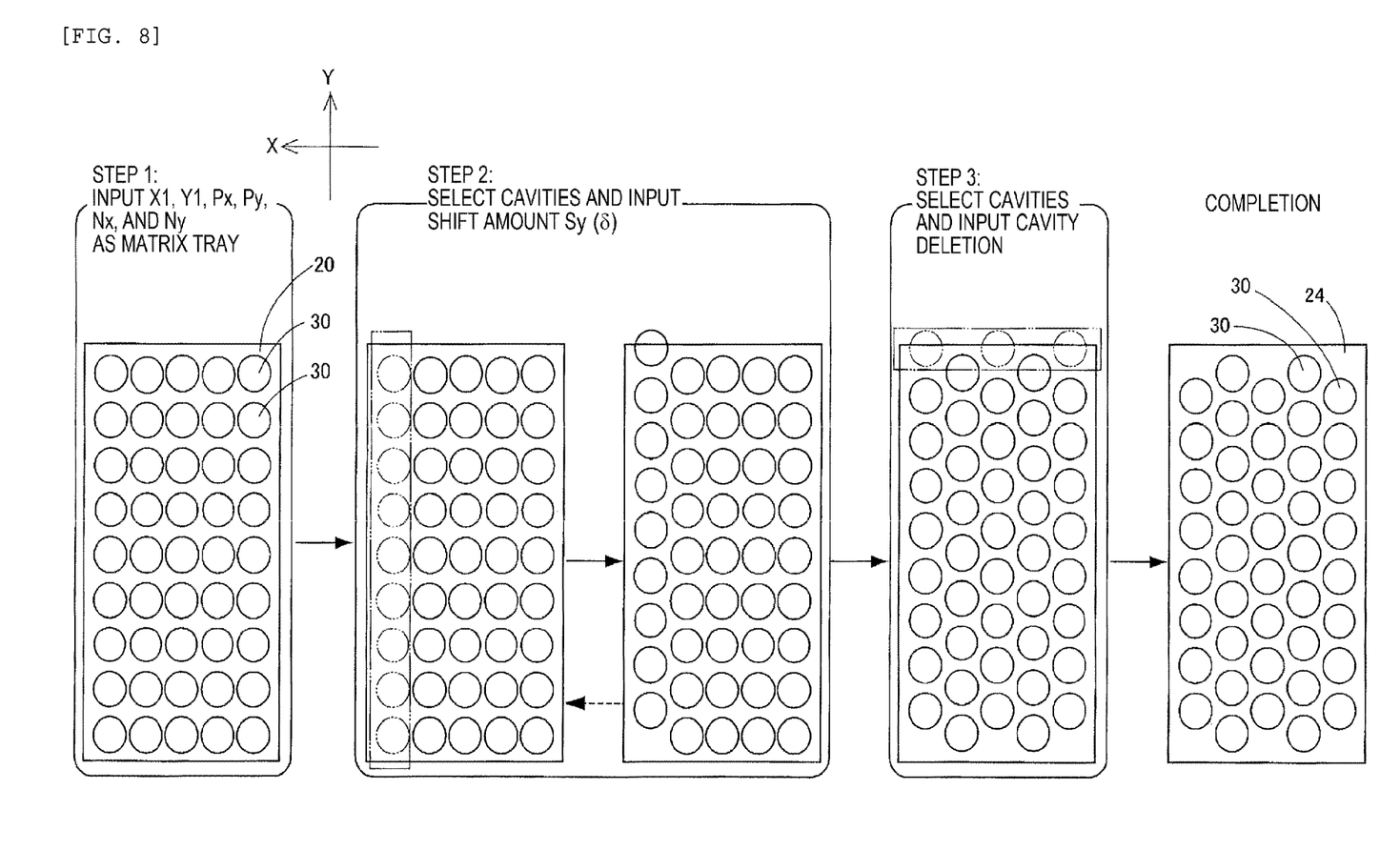
FIG. 8 is a view illustrating a procedure of generating cavity arrangement data of the nonmatrix tray illustrated in FIG. 5C.

In comparison, as illustrated in FIG. 8, the generation of the pick-up instruction data of the nonmatrix tray 24 is performed, based on the pick-up instruction data of the matrix tray 20 on the left end in FIG. 8. The matrix tray 20 illustrated in FIG. 8 looks different from the matrix tray 20 illustrated in FIG. 7; however, the view only looks different for easy understanding. Actually, the pick-up instruction data of the matrix tray does not contain data of the shape of the cavities 30, but includes the coordinates of the central positions of the cavities 30 as described above. Therefore, in the integrated control device 130 (also in the module control device 120) virtually, there is no difference between the matrix tray 20 illustrated in FIG. 8 and the matrix tray 20 illustrated in FIG. 7.

As illustrated as step 1 in FIG. 8, in the generation of the pick-up instruction data of the nonmatrix tray 24, first, the pick-up instruction data of the matrix tray 20 is input and the arrangement of the cavities 30 in the matrix tray 20 is displayed on the display 134. Then, as illustrated as step 2, an operator designates the cavities belonging to the leftmost column surrounded in a two-dot chain line, of the displayed cavities 30, and inputs δ as the shift amount Sy of the cavities 30 in the Y-axial direction. The display on the display 134 is changed to the view on the right side in step 2, in response to the input. Similarly, odd-numbered cavity columns such as the third cavity column and the fifth cavity column from the end of the left side are sequentially designated, the shift amounts Sy of the columns in the Y-axial direction are input, the display on the display 134 is changed in response to the input, and, finally, the display of the cavity arrangement is changed to a state in a second view from the right in FIG. 8. Then, the operator designates the cavities 30 surrounded in a two-dot chain line in step 3 and instructs removal of data corresponding to the cavities 30. The instruction is performed, thereby, the pick-up instruction data of the nonmatrix tray 24 is completed, and the cavity arrangement is modified to the rightmost view in FIG. 8.

The generation procedure of the pick-up instruction data of the nonmatrix tray 24 is not limited to the procedure described above. For example, it is possible to reverse the input order of the instruction of the shift and the instruction of the removal. In other words, in the matrix tray 20, three cavities 30 corresponding to three cavities 30 designated in step 3 in FIG. 8 may be first designated, and the shift of the odd-numbered columns may be instructed after the removal of the three cavities 30. To be described in a generalized manner, the removing instruction of the arrangeable position may also mean that some of the plurality of arrangeable positions are removed from the matrix arrangement defined in the matrix arrangement data, or that some of the plurality of arrangeable positions after a change in the matrix arrangement (for example, the plurality of arrangeable positions shifted by an arrangeable position shifting section, as in an example illustrated in FIG. 8) may be removed.

During production of a real electronic circuit, the pick-up instruction data generated in such a manner is transmitted from the integrated control device 130 to the module control device 120 of each of the mounting modules 12 and 14 and is stored as automatic mounting data, along with other data, in the memory sections 126 of the module control devices 120, and execution of the automatic mounting data causes the electronic circuit to be produced.

As clearly described above, in the present Example, a portion, which generates the pick-up instruction data of the integrated control device 130, configures an electronic-circuit-component pick-up instruction data generating device, and a portion, which generates the nonmatrix arrangement data by modifying a part of the matrix arrangement data, configures a matrix arrangement data modifying section as an example of a matrix arrangement data-dependent nonmatrix arrangement data generating section. Also, the arrangeable position shifting section or an arrangeable position removing section is an example of the matrix arrangement data modifying section. In addition, a portion of the display 134, on which an image of the cavities 30 of the matrix tray 20 is displayed, configures a matrix arrangement cavity image displaying section, and a cavity image shifting section as a portion that shifts a part of a cavity image, and a cavity image deleting section as a portion that deletes a part of the cavity image are an example of a cavity image modifying section.

In other words, in Example described above, designation of cavities 30, of which the arrangement is to be modified, is performed by unit of a cavity group as one row or one column of the matrix tray 20; however, it is possible to perform the designation for each individual cavity 30, and, in this manner, modification flexibility from the matrix arrangement to the nonmatrix arrangement is increased.

In addition, in Example described above, since the change from the matrix tray to the nonmatrix tray is viewed as an actual change of the image of the cavities 30, it is advantageous that it is easy to understand the change, and it is easy to check the validity of the pick-up instruction data of the generated nonmatrix tray, to check that there is no interference between the cavities or between the components. However, since only the data of the central positions of the cavities is required in order for the suction nozzle to hold the component, (display state changing section) the cavities, which are to be modified, may be shown by being surrounded in a two-dot line or in a dash line, or by being classified by color, and (difference displaying section) meaning of the change may be displayed by other means which a person can recognize, such as a character, a sign, or the like, and/or instead thereof, (difference notifying section) acoustic notification may be performed.

Further, data for inputting the data of the matrix tray may exist in advance, or, when the data does not exist, a person may measure each portion of the real tray and may obtain data thereof.

REFERENCE SIGNS LIST

10: electronic-circuit-component mounting line, 12, 14: mounting module, 15: component supply device, 18: tray feeder, 20: matrix tray, 22, 24: nonmatrix tray, 26: tray holding table, 30: cavity, 40: board conveying and holding device, 76: module main body, 80: mounting device, 82: mounting head, 84: head moving device, 100: suction nozzle, 102: imaging device, 104: fiducial mark, 120: module control device, 126: memory section, 130: integrated control device, 132: input/operation device, 134: display, 136: memory section

The invention claimed is:

1. An electronic-circuit-component pick-up instruction data generating device comprising:
    an integrated control device operatively associated with at least one of module control devices and at least one of mounting modules including:
        an input device that is operated to input data;
        a memory section that stores the data; and
        a display that displays the data input from the input device, wherein the integrated control device is configured to
        generate pick-up instruction data for automatically picking up an electronic circuit component from a tray set to have nonmatrix arrangement different from matrix arrangement in which arrangeable positions of a plurality of electronic circuit components are regularly arranged in a state of being positioned at all the intersection points made by two groups of straight lines that are parallel to two directions orthogonal to each other, respectively, and that are separated at regular intervals for each direction;
        generate data of nonmatrix arrangement based on data of the matrix arrangement, in response to input from the input device, by modifying at least a part of the data of matrix arrangement; and
        shift each of the plurality of arrangeable positions defined on the data of matrix arrangement, in at least one of the two directions, and wherein the display is configured to
display the generated data;
display an image of matrix arrangement cavities defined by the matrix arrangement data, in response to the input of the data of matrix arrangement from the input device; and
change the image of matrix arrangement cavities displayed to an image of cavities in the nonmatrix arrangement, in which the display is actually shifted by a distance in response to the data of shift.

2. An electronic-circuit-component pick-up instruction data generating device comprising:
an integrated control device operatively associated with at least one of module control devices and at least one of mounting modules including:
an input device that is operated to input data;
a memory section that stores the data; and
a display that displays the data input from the input device,
wherein the integrated control device is configured to
generate pick-up instruction data for automatically picking up an electronic circuit component from a tray set to have nonmatrix arrangement different from matrix arrangement in which arrangeable positions of a plurality of electronic circuit components are regularly arranged in a state of being positioned at all the intersection points made by two groups of straight lines that are parallel to two directions orthogonal to each other, respectively, and that are separated at regular intervals for each direction;
generate data of nonmatrix arrangement based on data of the matrix arrangement, in response to input from the input device, by modifying at least a part of the data of matrix arrangement; and
remove some of the plurality of arrangeable positions defined on the data of matrix arrangement, and
a wherein the display is configured to
display the generated data;
display an image of matrix arrangement cavities defined by the matrix arrangement data, in response to the input of the data of matrix arrangement from the input device; and
delete an image of cavities corresponding to the removed arrangeable positions, in response to the removal instruction input from the input device, from the image of matrix arrangement cavities displayed on the display.

3. An electronic-circuit-component pick-up instruction data generating device comprising:
an integrated control device operatively associated with at least one of module control devices and at least one of mounting modules including:
an input device that is operated to input data;
a memory section that stores the data; and
a display that displays the data input from the input device,
wherein the integrated control device is configured to
generate pick-up instruction data for automatically picking up an electronic circuit component from a tray set to have nonmatrix arrangement different from matrix arrangement in which arrangeable positions of a plurality of electronic circuit components are regularly arranged in a state of being positioned at all the intersection points made by two groups of straight lines that are parallel to two directions orthogonal to each other, respectively, and that are separated at regular intervals for each direction; and
generate data of nonmatrix arrangement based on data of the matrix arrangement, in response to input from the input device, by modifying at least a part of the data of matrix arrangement, and
wherein the display is configured to
display the generated data;
display an image of matrix arrangement cavities defined by the matrix arrangement data, in response to the input of the data of matrix arrangement from the input device;
change a display state of a cavity image corresponding to at least a part of the data of matrix arrangement modified by the matrix arrangement data modifying section, from the displayed image of matrix arrangement cavities, into a display state of a cavity image corresponding to another cavity; and
display a difference between the cavity displayed in the changed display state from the display state of the cavity image corresponding to the other cavity in a recognizable state by a human being.

* * * * *